(12) United States Patent
Rogel-Favila et al.

(10) Patent No.: US 10,634,723 B2
(45) Date of Patent: Apr. 28, 2020

(54) METHOD AND SYSTEM FOR ACQUISITION OF TEST DATA

(71) Applicant: Advantest Corporation, Tokyo (JP)

(72) Inventors: Ben Rogel-Favila, San Jose, CA (US);
Mei-Mei Su, Mountain View, CA (US);
John Frediani, San Jose, CA (US);
Shunji Tachibana, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 106 days.

(21) Appl. No.: 15/861,570

(22) Filed: Jan. 3, 2018

(65) Prior Publication Data

US 2018/0188322 A1 Jul. 5, 2018

Related U.S. Application Data

(60) Provisional application No. 62/441,934, filed on Jan. 3, 2017.

(51) Int. Cl.
*G01R 31/319* (2006.01)
*G01R 31/317* (2006.01)
*G01R 31/3177* (2006.01)
*G01R 31/28* (2006.01)

(52) U.S. Cl.
CPC ... *G01R 31/31907* (2013.01); *G01R 31/2844* (2013.01); *G01R 31/3177* (2013.01); *G01R 31/31703* (2013.01); *G01R 31/31725* (2013.01); *G01R 31/31908* (2013.01)

(58) Field of Classification Search
CPC ........ G01R 31/31703; G01R 31/31907; G01R 31/2844; G01R 31/31908; G01R 31/3177; G01R 31/31725
See application file for complete search history.

(56) References Cited

U.S. PATENT DOCUMENTS

| | | | |
|---|---|---|---|
| 6,142,683 A * | 11/2000 | Madduri | G06F 11/348 703/23 |
| 7,076,385 B2 | 7/2006 | Horne et al. | |
| 7,188,063 B1 * | 3/2007 | Snyder | G06F 11/3656 703/26 |
| 8,138,778 B1 | 3/2012 | Smith | |
| 8,839,055 B2 | 9/2014 | Elserougi et al. | |
| 9,311,203 B2 | 4/2016 | Melzer et al. | |

(Continued)

*Primary Examiner* — Cynthia Britt

(57) ABSTRACT

The present invention facilitates efficient and effective device testing and debugging. In one embodiment, a tester system includes a controller processor; a plurality of programmable accelerator circuits coupled to and controlled by the controller processor; and a plurality of load boards respectively coupled to the plurality of programmable accelerator circuits. The plurality of load boards can apply the input test signals to a plurality of devices under test (DUTs) and capture the output test signals therefrom. The plurality of programmable accelerator circuits can provide input test signals and capture output test signals. In one exemplary implementation, each of the plurality of load boards comprises: a first set of connections for transmitting input test signals to a respective DUT; a second set of connections for receiving output test signals from the respective DUT; and sideband connectors. The sideband connectors receive test related information from the DUT.

18 Claims, 6 Drawing Sheets

(56) References Cited

U.S. PATENT DOCUMENTS

| | | | |
|---|---|---|---|
| 2005/0204225 A1* | 9/2005 | Whetsel | G01R 31/318594 714/726 |
| 2009/0158105 A1* | 6/2009 | Konda | G01R 31/318555 714/729 |
| 2010/0011130 A1* | 1/2010 | Tasher | G06F 11/3656 710/6 |
| 2011/0068820 A1* | 3/2011 | Fox | G01R 31/3016 326/16 |
| 2013/0339789 A1* | 12/2013 | Menon | G06F 11/267 714/27 |
| 2014/0024315 A1* | 1/2014 | Olgaard | H04B 17/00 455/67.11 |
| 2016/0047859 A1* | 2/2016 | Deutsch | G06F 11/348 714/734 |
| 2017/0115344 A1* | 4/2017 | Kuehnis | G01R 31/31715 |

\* cited by examiner

METHOD AND SYSTEM FOR ACQUISITION OF TEST DATA

RELATED APPLICATIONS

This Application claims the benefit of and priority to Provisional Application No. 62/441,934, entitled "Method and System for Acquisition of Test Data", filed Jan. 3, 2017, which is incorporated herein by reference in its entirety.

FIELD OF THE INVENTION

The present invention relates to the field of electronic testing systems.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices are typically tested to ensure proper operation. While testing of the systems and devices has made significant advances, traditional approaches to debugging problems or issues that are discovered during the testing is somewhat more problematic.

Most devices under test (DUTs) typically have an external port that is made available on the DUT for communicating information used to analyze or debug operations within the device. In one example, the external port is part of a solid state device (SSD) that includes the ability to monitor activities within a device controller. A typical issue with conventional monitoring of traffic and transactions taking place inside the DUT for debug analysis is that they typically require the DUT to be connected to a discrete external instrument (e.g., external monitor). This usually means that the DUT has to be disconnected and removed from the testing environment and connected to an external wiring harness that communicates the information to the external instrument. Furthermore, during device bring-up in typical traditional approaches, only a single DUT can be debugged at a time. The user often has to disrupt or interrupt other testing activities to hook up an external monitor to the DUT to be able to debug the DUT.

As products have matured, there is a preference for testing to be performed on a high number of DUTs in parallel (e.g., 128 DUTs, etc.). A prolonged testing time associated with doing testing and monitoring on an individual DUT basis is undesirable. However, in typical conventional testing and debugging, if an issue arises (e.g., failure, error, etc.), then extra time and effort is expended removing the "problem" DUT from the testing environment and connecting the DUT individually to the external wiring harness and monitoring device to analyze or debug the issues. Therefore, conventional testing approaches are often a major obstacle to throughput. Furthermore, in traditional testing approaches, the connection of the DUT to external wiring typically prevents it from being tested while being located in a temperature chamber used for testing. Stopping and removing the DUT from the testing environment means additional time and effort is usually needed to attempt to re-create the conditions of the failure in order to diagnose it. This additional time and effort in attempting to re-create the problem can be significant and sometimes the precise conditions can not be reliably recreated. In addition, the conventional external wiring for debug operations often results in a web of wires that impede testing because each DUT typically needs to be connected to the dedicated external monitor using a separate wire.

SUMMARY

Embodiments of the present invention facilitate efficient and effective device testing and sideband information collection. In one embodiment, the sideband information includes debug information that is collected while a DUT is in a test environment without the need for removing the DUT from the test environment and connecting to external wiring and debug system. In one exemplary implementation, the debug information is correlated with real time text environment context and result information without the need for attempts to recreate the environment context and result information externally.

In one embodiment, a tester system comprises: a controller processor; a plurality of programmable accelerator circuits coupled to and controlled by the controller processor, the plurality of programmable accelerator circuits for providing input test signals and for capturing output test signals; and a plurality of load boards respectively coupled to the plurality of programmable accelerator circuits, the plurality of load boards for applying the input test signals to a plurality of devices under test (DUTs) and for capturing the output test signals therefrom. In one exemplary implementation, each of the plurality of load boards comprises: a first set of connections for transmitting input test signals to a respective DUT; a second set of connections for receiving output test signals from the respective DUT; and sideband connectors. The sideband connectors receive test related information from the DUT. In one embodiment, the test related information is operable to be used for debug purposes. The sideband information can be received from the respective DUT in coincidence with receiving the output test signals from the respective DUT. The first set of connections, the second set of connections, and the sideband connectors are operable electrically couple to input/output pins of the respective DUT. The first set of connections, the second set of connections, and the sideband connectors can also be operable to physically couple to input/output pins of the respective DUT.

In one embodiment, the plurality of load boards is operable for receiving, in parallel, a plurality of respective test related information from said plurality of DUTs and further comprising a memory coupled to said controller processor, wherein said memory is operable to receive and store said plurality of respective test related information. The controller processor can be a central processing unit (CPU). Content of said test related information can be programmable and customer specific. Each of said plurality of programmable accelerator circuits can include a field programmable gate array circuit. In one exemplary implementation, the test related information of said respective DUT can be captured and stored in synchronization with input and output test signals of a test program testing the respective DUT.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Embodiments of the present invention facilitate convenient and efficient testing and retrieval of sideband information. The sideband information can be retrieved while a device under test is in a testing environment. There can be a plurality of devices under test (DUTs) in the testing environment at overlapping time frames and sideband information can be gathered (either asynchronously or synchronously) from the plurality of DUTS while they are in the test environment. In one embodiment, the testing and sideband information gathering is considered a massively parallel collection of DUT information. Retrieving the sideband information in the test environment facilitates maintenance and analysis of contexts (e.g., functional context, temperature context, pressure context, etc.) associated with generation of the sideband information. The sideband information and contexts can be correlated with in-band testing information. It is appreciated that embodiments can be compatible with retrieval of a variety of sideband information. In one exemplary implementation, the sideband information can include debug information.

Figure 1A:
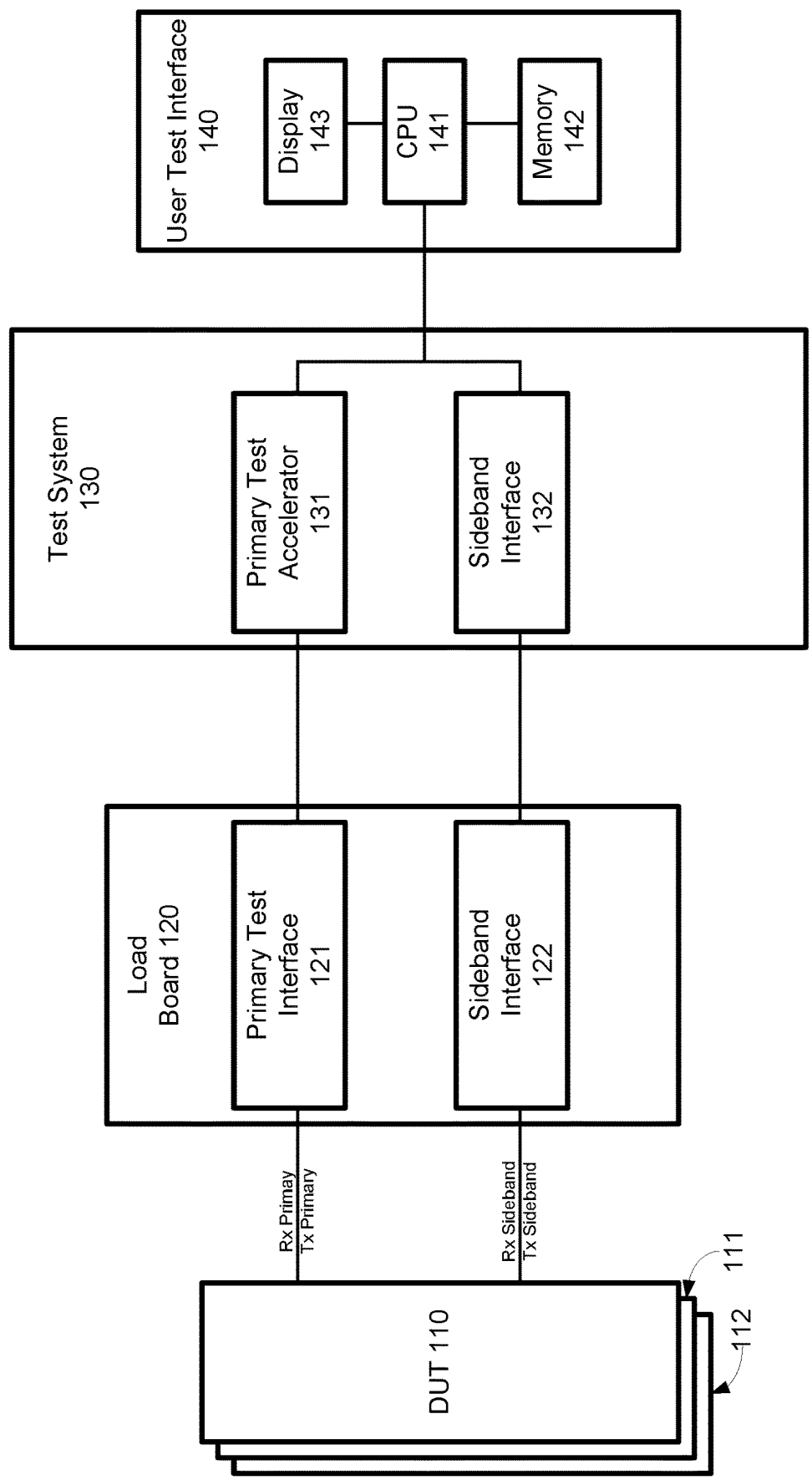
FIG. 1A is a block diagram of an exemplary test environment or system in accordance with one embodiment.

FIG. 1A is a block diagram of an exemplary test environment or system 100 in accordance with one embodiment. The test environment or system 100 includes devices under test (DUT) (e.g., 110, 111, 112, etc.), test or load board 120, test system 130, and user test interface 140. The DUTs (e.g., 110, 111, 112, etc.) are coupled to the test board 120 which is coupled to test system 130, which in turn is coupled to the CPU 141. In one embodiment, the test board 120 includes primary or persistent test interface 121 and sideband interface 122, and test system 130 includes primary or persistent test interface 131 and sideband interface 132. User test interface 140 includes CPU 141, memory 142, and display 143. In one embodiment, the test system 130 comprises an FPGA, wherein the FPGA includes primary test signal interface or accelerator 131 and first sideband interface 132. The FPGA can be configured to perform preliminary analysis and reconfiguration of persistent test information, and also perform preliminary analysis reconfiguration of debug information for communication to an external device. Load board 120 is configured to electrically and physically couple a device under test to the test system. The load board comprises a persistent test interface and a sideband interface between the device under test and the test system.

In one embodiment, the sideband interface is a debug interface. The debug interface can include physical and electrical sideband interface connections. While in a test environment, the debug interface can communicate information associated with monitoring activities and traffic inside the device under test. The debug information can include error information, performance information, status information, event information, and so on. The debug interface enables communication of debug information without coupling any additional dedicated external wiring harnesses. The debug interface enables debug information to be captured on the fly during (e.g., coincident with, in parallel with, etc.) test environment contexts. In one embodiment, the debug information is retrieved or gathered while a DUT is in a test environment. The test environment can provide controlled conditions (e.g., being in a test chamber, test oven, etc.). In one exemplary implementation, the debug information gathering can be performed coincident with in-band testing time frames. The debug interface enables debug information to be captured coincident to performing in-band testing operations. Independent debug operations can be performed on a plurality of DUTs in parallel. As shown in FIG. 1, many DUTs may be coupled to the load board 120. The debug interface is compatible with a variety of protocols (e.g., Joint Test Action Group (JTAG), Universal Asynchronous Receiver Transmitter (UART), Inter-Integrated Circuit (I2C), Universal Serial Bus (USB), Peripheral Component Interconnect Express (PCIe), etc.).

In one embodiment, a sideband channel interface is provided on the tester itself and can connect directly to the test or load board to which the corresponding DUT is plugged into. These sideband channels can be used to monitor the information and traffic inside the DUTs. The sideband signal interface can be configured in a variety of communication or bus protocols (e.g., compatible with JTAG, UART, I2C, USB, etc.) and it can be part of the pin-out of the tester itself. When the DUT is connected to the tester, the tester provides the communication or bus protocols capability (e.g., UART, I2C, JTAG, etc.). Similarly, the sideband signals communicated on the sideband channels can be configured into a corresponding desired or compatible protocol. In one exemplary implementation, the sideband connectors are coupled to the device or load board and additional external wiring is not required. In one exemplary implementation, this can allow the DUT to be tested within a temperature chamber advantageously without having to connect an external wire/harness directly to the DUT. In one embodiment, using the sideband channels is directly integrated into the system, so it does not require external components. The sideband channels can also be adapted to support different types of SSDs or DUTs (e.g., they can be configured to support JTAG, I2C, UART, etc.).

Figure 1B:
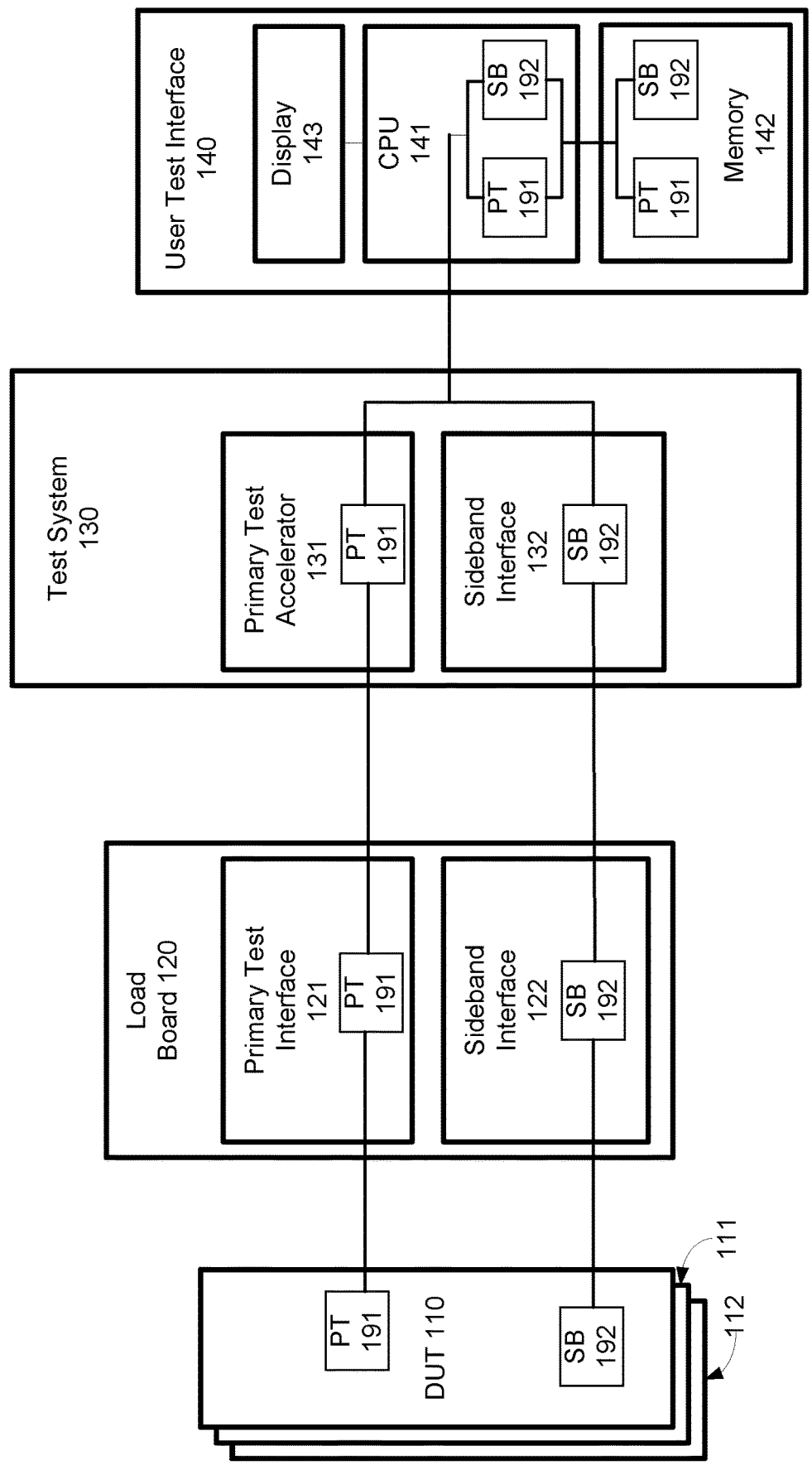
FIG. 1B is a block diagram of an exemplary information flow in a test environment or system in accordance with one embodiment.

FIG. 1B is a block diagram of an exemplary information flow in a test environment or system in accordance with one embodiment. In-band or primary test (PT) information 191 flows between DUTs (e.g., 110, 111, 112, etc.) and user interface 140 via primary test interfaces 121 and 131. Side band (SB) information 192 flows between DUTs (e.g., 110, 111, 112, etc.) and user interface 140 via sideband interfaces 122 and 132. CPU 141 processes the in-band or primary test (PT) information 191 and side band (SB) information 192 and directs storage of them in memory 142. The display 143 can display the information and processing results.

In one embodiment, the actual testing takes place using a PCIe protocol and the load boards that the DUTs connect to have sideband signal support. In one exemplary implementation, there is a sideband port on the load board and tester. Therefore, the load board and tester can communicate via the sideband channels and monitor the activities of the signals on the DUT while the testing is in progress. This can allow a user to collect data from a DUT and review it for diagnostic purposes without having to connect the DUT directly to external components. In one exemplary implementation, the data can be captured on the fly using a separate CPU that is running on a side module. In one embodiment, the testing accelerator (e.g., FPGA, SOC, etc.) performs the testing on the DUT and a side module has a CPU that is used to collect and monitor data traffic on the DUT while the testing is being performed. The data and traffic can be associated with debug operations. These operators can be under customer control and can be specific to the test procedure or the DUT or both.

The in-band and sideband interfaces can include respective transmit and receive connections. The in-band interface can also include a reset signal connection. In one embodiment, the sideband interface includes hardware connection components, firmware components, and software components. For ease of explanation, reference to a Universal Asynchronous Receiver Transmitter (UART) compatible interface is made to explain an embodiment. However, the present invention is not necessarily limited to a UART compatible embodiment or implementation. It is understood that embodiments of the present invention can be compatible and implemented with other protocols (e.g., JTAG, I2C, PCIe, etc.).

In one embodiment, on a per DUT basis, the UART compatible interface includes a basic 2 wire serial communication interface, including transmit (TX) data and receive (RX) data, with no flow control signals. In one exemplary implementation, a hardware (HW) connection interface is hard wired to use sideband pin 10 for TX Data and sideband pin 9 for RX Data.

Figure 2:
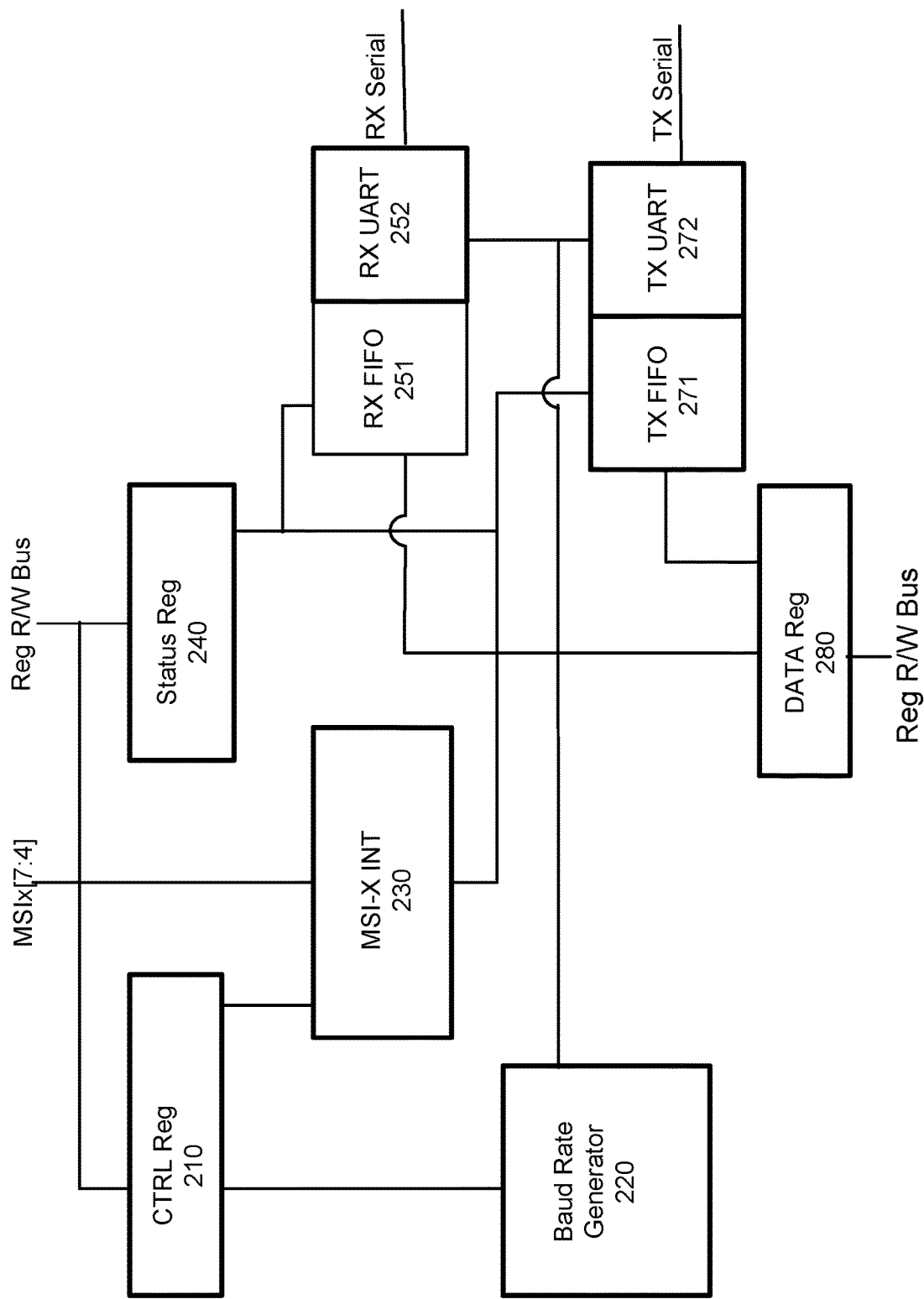
FIG. 2 is a block diagram of exemplary software interface components in accordance with one embodiment.

FIG. 2 is a block diagram of exemplary interface components of a side band interface in accordance with one embodiment. In one embodiment, the interface components include software components. In one exemplary implementation, the sideband interface is similar to the sideband interfaces 122 and 123 of FIG. 1. The software (SW) interface comprises or corresponds to 5 UART registers including Control register 210, Status register 240, Data register 280, TX valid register 271, and RX Valid register 252. The interface can also include MSI-X interrupt register 230 on bits [7:4] depending on the port. The software interface components also include baud rate generator 220. In one exemplary implementation, for low speed operation, the Baud Rate is programmable in steps from 9600 to 153,600 that are software (SW) backward compatible to existing SW. A High Speed mode can include additional ranges covering from 921,600 Baud to 2.5M Baud. The High Speed mode can include a high speed sideband connection either via CPLD update or a main PCB board. In one embodiment, the UART firm ware (FW) and software (SW) can operate the same way for all rates. Transmit (TX) data is written by the SW one byte at a time to the 2K×8 UART TX FIFO via the Data Register. In one embodiment, whenever the TX FIFO is not empty, the UART logic will read a byte from the FIFO, do the parallel to serial conversion, add the start and stop bits, and send the serial stream to the CPLD. The FW also detects Serial data input from the CPLD, strips off the start and stop bits, collects a data byte, and writes a byte to the 2K×8 RX FIFO. When the RX FIFO is not empty SW can retrieve data bytes with a read of the UART Data Register. Status and interrupt bits are available as well as the RX and TX Valid registers, so SW can monitor the state of the FIFOs to control sending and receiving data.

The FW can include 4 independent blocks, Baud Rate generation, MSI-X INT, Transmit, and Receive. The FW can also include the System Register R/W Interface. In one embodiment, the Baud Rate Generator uses a 100 MHz Com board PCIE REFCLK as input to a PLL that provides baud reference clocks for 4 ranges. The baud refclk feeds a 12 bit programmable divider. The divisors provided by SW via the UART CTRL register produce ×16 baud rate clocks that fall within 0.3% of the nominal frequency for all baud rates. Range 0 is the default and is backward compatible with the existing Lite-On UART. In one embodiment, all other ranges are high speed and are selected by SW setting the UART CTRL register [15:13]. When ranges other than 0 are selected for a Pluto system, for example, the high speed path data path will be selected for TX and RX data. In one exemplary implementation, the ranges include the following:

| Range 0 | 9600, 19,200, 38,400, 76,800, 115,200, 153,600 |
| Range 1 | 921,600 |
| Range 2 | 1.25M, 2.5M |
| Range 3 | 1M, 2M |

In one exemplary implementation, the TX UART and the 2K×8 TX FIFO are closely integrated. There are 3 associated status bits, TX FIFO EMPTY, TX FIFO NOT FULL, and TX OVERFLOW as well as a TX Valid register. As long as TX FIFO NOT FULL is true, the SW can send data to be transmitted to the TX FIFO a byte at a time via a write to the UART DATA register. FW detects not TX FIFO EMPTY and reads a byte from the FIFO. It then initiates a transfer on the TX serial data line, first sending a START bit then the serialized byte then a stop bit. In one exemplary implementation, the TX FIFO cannot underflow since the TX UART FW is only activated if the TX FIFO is not empty. However, a TX FIFO Overflow may be possible if SW attempts to write a byte when the TX FIFO is FULL. The TX Valid register is readable by SW to indicate how many of the 2 k locations are currently occupied with data waiting to be sent, checking it will allow SW to determine how much space is available so it can write multiple bytes with no need to read status for each byte. The TX_FIFO_Flush bit in the UART CTRL register resets the TX FIFO to Empty and TX_Valid to 0.

In one exemplary implementation, the RX UART and its 2 k×8 RX FIFO are closely integrated. The FW monitors the RX serial data line and whenever it detects a start bit (e.g., with 1 clock hysteresis, etc.) it can accumulate the next 8 bits as a data byte. If the start and stop framing are correct, it writes the data byte to the RX FIFO. There are 3 associated status bits, RX FIFO NOT EMPTY, RX OVERFLOW and RX UNDERFLOW. When RX FIFO is NOT EMPTY the SW can receive a data byte by reading the UART DATA register. If SW attempts to read the RX FIFO when it is empty that will cause an RX UNDERFLOW, and if the FW attempts to write a data byte when the RX FIFO is full that will cause an RX OVERFLOW. In one exemplary implementation, there is no flow control on the serial interface, however SW reads data fast enough to keep the FIFO from overflowing. Checking the RX_Valid register allows SW to determine how many valid bytes are available to be read without reading status for each byte. The RX_FIFO_Flush bit in the UART CTRL register resets the RX FIFO to Empty and RX_Valid to 0.

In one embodiment, the sideband UART uses previously unused MSI-X interrupt slots [7:4] corresponding to DUT [3:0]. UART interrupts are generated by a 0 to 1 transition of the 3 RX and 3 TX FIFO status signals below. Since interrupt latency can prevent interrupting for every byte sent or received, the interrupts are used to signal certain significant operational conditions such as error conditions or FIFO ready to be written to or read from. Interrupt sources are maskable via UART CTRL register[4:0]. Interrupts can be set by the 0 to 1 transition of the status bit (e.g., which can include the not full, not empty signals, etc.). In one exemplary implementation, the error interrupt sources can only be cleared by a rx_flush or tx_flush command, but the other status bits can change when the FIFO is read from or written to. In one embodiment, the interrupt bit is cleared by writing a 1 to the appropriate bit in the status reg. In one embodiment, the interrupts pulse only. The status can be available to SW to determine a cause of the interrupt.

Potential TX interrupts sources are:
tx_overflow An attempt was made by SW to write a BYTE to transmit, but the TX FIFO was full.
tx_fifo empty TX FIFO has transitioned to the empty state. This interrupt allows SW to load a message into the TX FIFO (provided it fits) and then get notice when it has all been sent.
tx_fifo_not full TX FIFO has transitioned from full to a half full or less than full state so now there is room for information (e.g., 1K bytes, 3K bytes, etc.) to transmit. When SW receives this interrupt there is room for at least 1 k bytes in the TX FIFO. SW can check the tx_valid register to see how many bytes may still be written. Exceeding half full will clear this interrupt.

In one embodiment, a fast transmit data rate is 2.5M BAUD, which means sending one byte every 4 usec. In one exemplary implementation, blocks of 1K bytes are sent using the tx_fifo not full interrupt. In one exemplary implementation, a FIFO is 2K bytes deep and the TX_Valid register provides an efficient way to transmit data. SW can use it to determine how much of the 2K FIFO is still available and can transfer a large number of bytes without further status reads.

Potential RX interrupts sources are:
rx_overflow A byte was received from the serial line, but the RX FIFO was full Irq_en is combined for rx_overflow and rx_underflow. An attempt was made by SW to read from an empty RX FIFO Irq_en is combined for rx_overflow and rx_underflow
rx_fifo_not empty RX FIFO has transitioned from empty to at least one byte of valid data received, after reading each byte SW will need to check rx fifo empty status before reading again and the RX FIFO must be totally emptied in order for the interrupt to be generated again. (Again an RXValid register will be provided which can be read at any time to indicate the number of valid bytes in the RX FIFO).

In one embodiment, a fast receive data rate is 2.5M BAUD, which means receiving one byte every 4 usec. In one exemplary implementation, individual bytes are read using the rx fifo not empty interrupt and checking the status before reading each byte to see if the rx fifo is empty yet. In one exemplary implementation, the RX_Valid register provides an efficient way to receive data. SW can use it to determine how much of the 2K FIFO has valid data to read, and can transfer a number of bytes without further status reads.

In one embodiment, SW configures the UART via a single UART CTRL Register. This allows the SW to set the Baud Rate, enable individual interrupts, reset the entire UART, and flush the rx or tx buffers. The UART Status Register can allow SW to read the state of 3 txfifo status bits—txfifo not full, txfifo empty, and txfifo overflow, and 3 rxfifo status bits—rxfifo not empty, rxfifo underflow and rxfifo overflow as well as the 5 pending interrupts potentially generated by the 6 status bits (rxfifo_underflow and rxfifo_overflow are combined to a single interrupt). The UART Data register allows SW to write one data byte at a time to the UART TX FIFO to be transmitted and to read one data byte at a time from the UART RX FIFO. The SW can also configure sideband signal pins.

Figure 3:
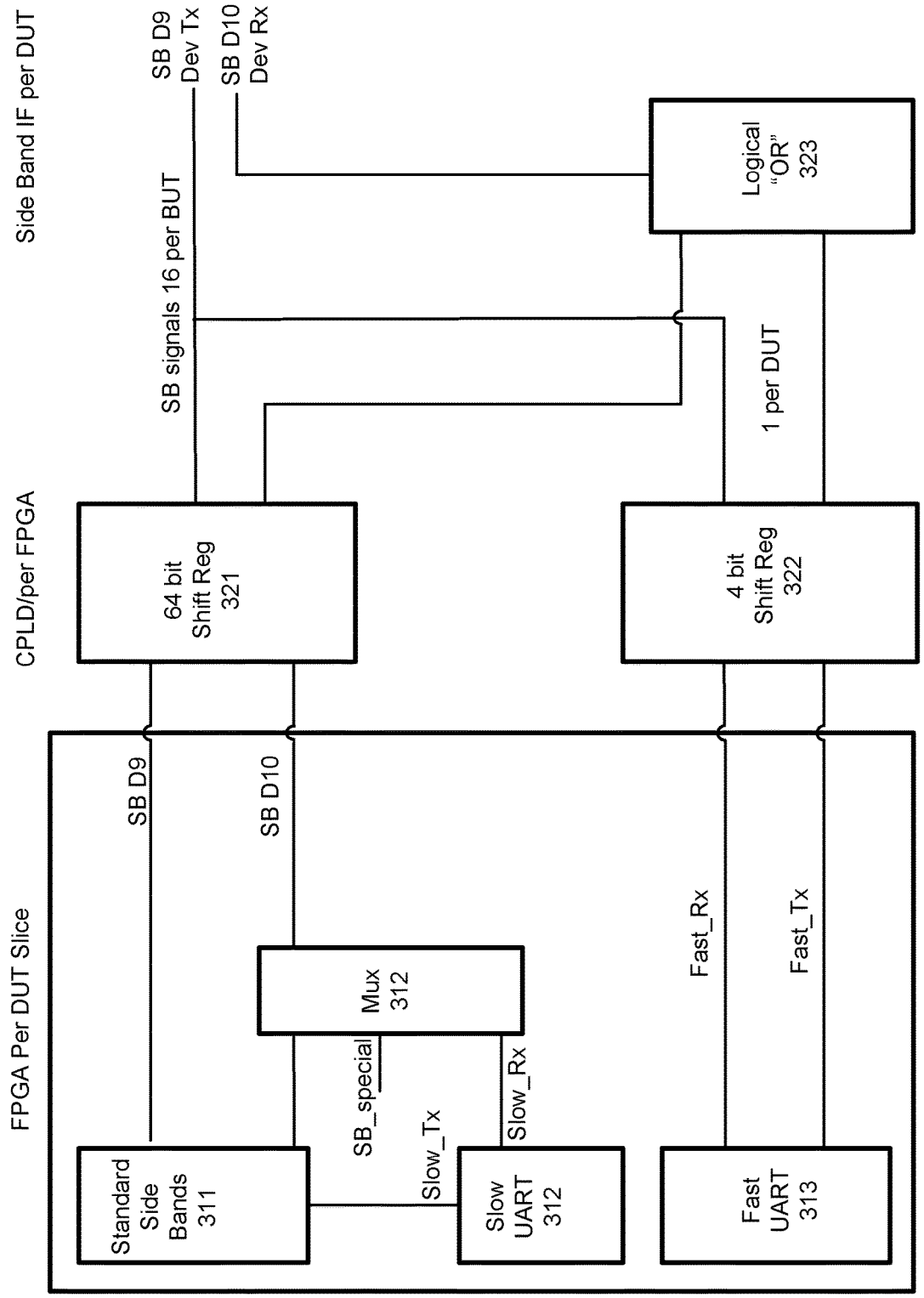
FIG. 3 is a block diagram of a Field Programmable Gate Array (FPGA)-Complex Programmable Logic Device (CPLD) Interface in accordance with one embodiment.

FIG. 3 is a block diagram of a FPGA-CPLD Interface in accordance with one embodiment. In one exemplary implementation, the FPGA-CPLD interface is similar to sideband interface 132. The FPGA-CLPD interface can include standard sideband interface 311, Slow UART 312, MUX 312, Fast UART 313, a first shift register 321, a second sift register 322, and logical OR 323. In one exemplary implementation, the sideband interface 311 can be mapped for debug operations. In one exemplary implementation, the CPLD interface module includes a 16-bit register called sb_gp_special. Each bit can correspond to a sideband pin and a special function is implemented for a sideband signal if the corresponding sb_gp_special bit is set. For the UART function SW sets both bits 9 and 10 of the sb_gp_special register in the downstream port registers register space. In one exemplary implementation, for Baud Rates up to 153, 600, nothing else needs to be done, the current CPLD module can function as usual and the data will be sent properly. For Baud Rates above 153,600 a high-speed sideband communication may be required and may require a new CPLD version.

In one embodiment, there are 6 potential use cases:
Case 1: Old CPLD, No UART FW. Sideband signals unaffected.
Case 2: Old CPLD, Slow UART FW. It can be supported at SB 9 and 10 dedicated to UART
Case 3: Old CPLD, Fast UART FW. Only Slow speeds supported by FW, SW should generate Warning if High Speed selected by user. SB 9 and 10 dedicated to UART.
Case 4: New CPLD, No UART FW. Sideband signals unaffected (due to Pull down on Device RX CPLD input).
Case 5: New CPLD, Slow UART FW. Backwards compatible with current implementations.
Case 6: New CPLD, Fast UART FW. Fast UART functionality in addition to backwards compatible slow UART.

In one embodiment, high speed data communication already exists between the FPGA and the CPLD for L1 power mode. It uses 3 previously unused FPGA-CPLD connections for the incoming signals from the CPLD, including:
miso_clkreq_d6_i
miso_clkreq_d8_i
miso_clkreq_fs_i Where the first two are the serial data for each pin and the third is a frame select that has a one cycle pulse that indicates the first bit of a 4 bit data stream, where the 4 bits of the stream are dedicated to DUTs 0-3. The serial data is saved into a four bit signal, one bit for each downstream port and routed to its respective PLDA input in place of the low speed signal.

Figure 5:
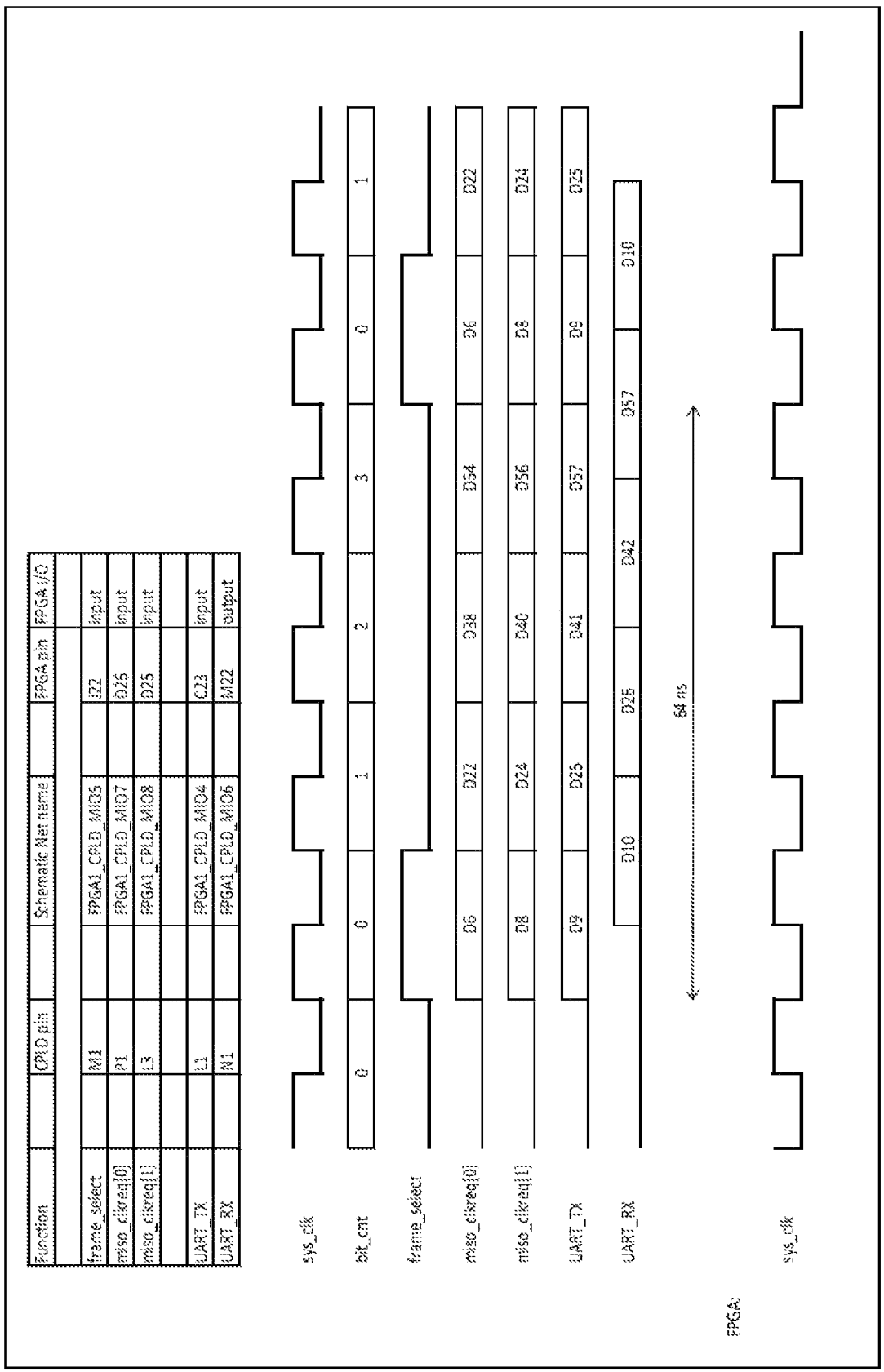
FIG. 5 is a block diagram of an exemplary pin configuration and corresponding signal timing in accordance with one embodiment.

For high speed UART, the remaining 2 unused FPGA-CPLD pins can be designated as tx_data and rx_data using the same frame select signal and the same 4 clock sequence as the L1 clkreq signals. FIG. 5 is a block diagram of an exemplary pin configuration and corresponding signal timing in accordance with one embodiment. In one embodiment, the rx_data input functions the same as the clkreq inputs. The rx-data can replace the slow speed signal and can be routed through the CPLD interface logic to the UART module. In one exemplary implementation, the tx_data output will require additional logic in the CPLD to collect the tx_data 4 bit stream into a 4 bit register and route the 4 signals to the correct sideband signal for each DUT. Since there will also be an existing low speed output the 2 signals can be combined. One exemplary method is to logically "OR" the two signals together. This can require that the tx_data output be initialized to a 0 state even if the UART has not been configured and that the slow signal be set to a value by SW when it wants to use the UART. In one exemplary implementation, it also requires that the updated CPLD code only be used with FPGA revisions that have the high speed UART FW. In one exemplary implementation, an additional (e.g., currently unused, new, etc.) sideband signal or an unused bit from the slow speed shift register is used to control a high speed/low speed mux for that sideband signal. In one embodiment, once new SPLD-FPGA signals are added, a timing analysis can be done to ensure setup and hold times are not violated.

Figure 4:
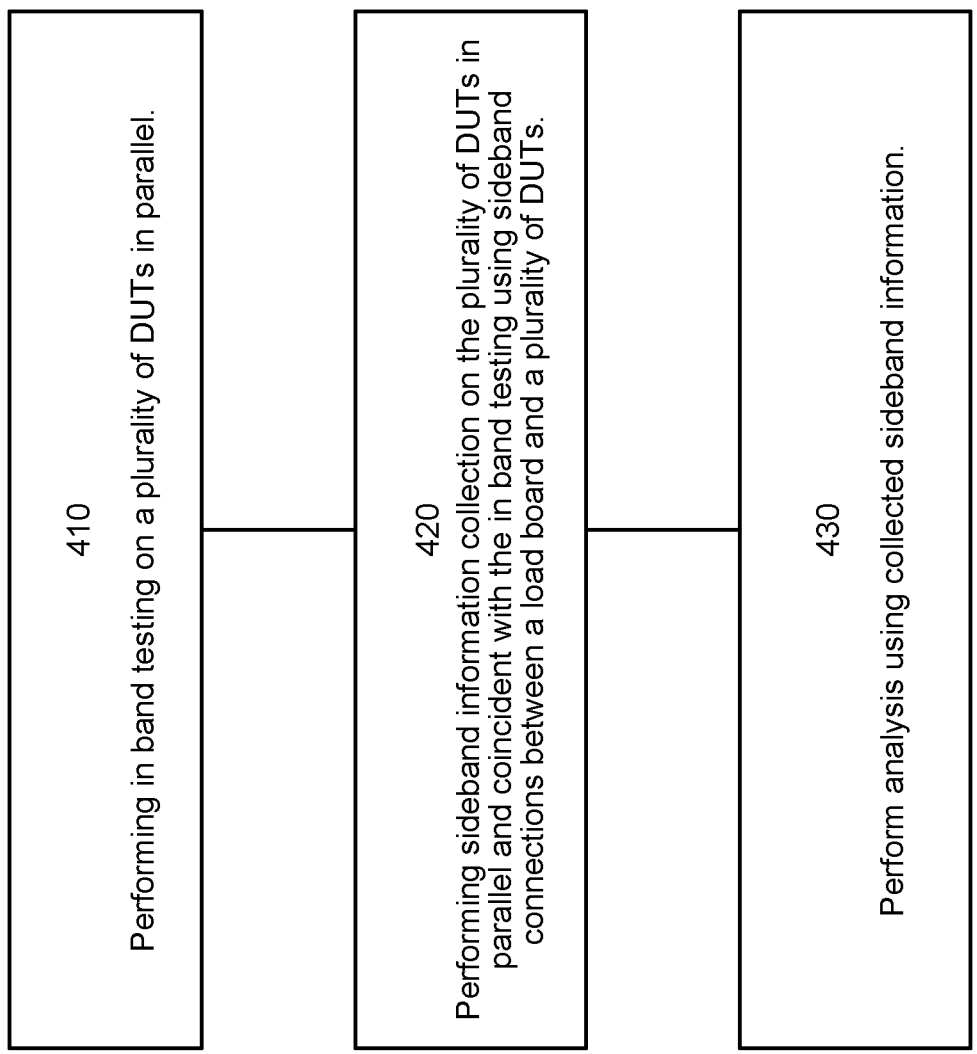
FIG. 4 is a flow chart of a testing and debugging method in accordance with one embodiment.

FIG. 4 is a flow chart of a testing and debugging method in accordance with one embodiment. In one embodiment, the testing and debug method includes testing and sideband information gathering on a plurality of DUTs coincidentally or in parallel. The testing and sideband information gathering is considered a massively parallel (e.g., 128 DUTs, 256 DUTs, etc.) collection of DUT information.

Block 410 includes performing in-band testing on a plurality of DUTs in parallel.

Block 420 includes performing sideband information collection on the plurality of DUTs in parallel and coincident with the in-band testing. The debug information collection is performed independently on the plurality of DUTs. In one exemplary implementation, the debug information is collected in real time. In one embodiment, context information, in-band testing information, and debug analysis information are correlated. The correlation can be performed by a test system (e.g., similar to test system 130, etc.). The correlation can include mapping or associating test environment or context information and in-band test information to debug information. In one exemplary implementation, context information (e.g., temperature, pressure, etc.) and testing information (e.g., test inputs, test results, etc.) at a particular time frame are associate with debug information (e.g., an error indication, a status indication, etc.) that corresponds to the same time frame.

In block 430, analysis is performed using the collected sideband information. In one embodiment, the sideband information is debug information and analysis of the debug information can be coordinated with context information and test information. In one exemplary implementation, an analysis examines the occurrence of a debug error indication that is correlated in block 420 to the occurrence of a test result.

Thus, embodiments of the present invention can facilitate efficient and effective in-band testing and side band information collection. In one embodiment, the debug information is collected while a DUT is in a test environment without the need for removing the DUT from the test environment and connecting to external wiring and debug system. In one exemplary implementation, the debug information is correlated with real time test environment context and result information without the need for attempts to recreate the environment context and function result information externally.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the specification includes a listing of exemplary concepts or embodiments associated with the novel approach. It is also appreciated that the listing is not exhaustive and does not necessarily include all possible implementation. The concepts and embodiments can be implemented in hardware. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

It is appreciated that a memory storage management systems and methods can include the following exemplary concepts or embodiments. It is also appreciated that the listing is not exhaustive and does not necessarily include all possible implementations. The following concepts and embodiments can be implemented in hardware, firmware, software and so on. In one embodiment, the following concepts include methods or processes that describe operations performed by various processing components or units. In one exemplary implementation, instructions or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A tester system, said system comprising:
   a controller processor;
   a plurality of programmable accelerator circuits coupled to and controlled by said controller processor, said plurality of programmable accelerator circuits for providing input test signals and for capturing output test signals; and
   a plurality of load boards respectively coupled to said plurality of programmable accelerator circuits, said plurality of load boards for applying said input test signals to a plurality of devices under test (DUTs) and for capturing said output test signals therefrom, wherein each of said plurality of load boards comprises:
      a first set of connections for transmitting input test signals to a respective one of said plurality of DUTs;
      a second set of connections for receiving output test signals from said respective one of said plurality of DUTs; and
      sideband connectors for receiving sideband information, including test related information from said respective one of said plurality of DUTs, wherein said test related information is operable to be used for debug purposes, and wherein further, said sideband information is received from said respective one of said plurality of DUTs at least in partial coincidence with receiving said output test signals from said respective one of said plurality of DUTs, wherein said first set of connections, said second set of connections and said sideband connectors are operable to physically and electrically couple to input/output pins of said respective one of said plurality of DUTs.

2. The tester system of claim 1, wherein said plurality of load boards is operable for receiving, in parallel, a plurality of respective test related information from said plurality of DUTs and further comprising a memory coupled to said controller processor, wherein said memory is operable to receive and store said plurality of respective test related information.

3. The tester system of claim 2, wherein said controller processor is a central processing unit (CPU).

4. The tester system of claim 1, wherein a content of said test related information is programmable and customer specific.

5. The tester system of claim 1, wherein each of said plurality of programmable accelerator circuits comprises a field programmable gate array circuit.

6. The tester system of claim 1, wherein said test related information of said respective one of said plurality of DUTs is operable to be captured and stored in synchronization with input and output test signals of a test program testing said respective one of said plurality of DUTs.

7. The tester system of claim 1, wherein said sideband information is collected in real time.

8. The tester system of claim 1, wherein independent debug operations and sideband information collection are performed independently and at least in partial coincidence on said plurality of DUTs.

9. The tester system of claim 1, wherein said sideband information includes debug related information, wherein said sideband connectors communicate said debug related information and said plurality of programmable accelerator circuits perform debug analysis.

10. The tester system of claim 1, wherein said sideband connectors enable communication of debug information without coupling additional dedicated external wiring harnesses.

11. The tester system of claim 1, wherein said sideband connectors enable debug information to be captured on-the-fly during persistent testing time frames.

12. The tester system of claim 1, wherein testing of said DUTs includes persistent testing and a portion of said persistent testing performed on said respective one of said plurality of DUTs is performed at least in partial coincidence with another portion of said persistent testing performed on another respective one of said plurality of DUTs, wherein said plurality of programmable accelerator circuits include respective persistent test signal interfaces that communicate respective persistent testing information.

13. The tester system of claim 1, wherein testing of said DUTs includes persistent testing, wherein persistent testing information and debug related information associated with said respective one of said plurality of DUTs are coordinated.

14. The tester system of claim 1, wherein said sideband connectors enable debug information to be captured at least in partial coincidence with performing persistent testing operations.

15. The tester system of claim 1, wherein said plurality of programmable accelerator circuits are configured to:
   perform preliminary analysis of persistent test information; and
   reconfiguration of debug information and said persistent test information for communication to an external device.

16. The tester system of claim 1, wherein said sideband connectors are operable to communicate information associated with monitoring activities and traffic inside said respective one of said plurality of DUTs.

17. The tester system of claim 1, wherein said sideband connectors are compatible with a protocol selected from said group comprising a Joint Test Action Group (JTAG) standards, a Universal Asynchronous Receiver-Transmitter (UART) protocol, a Inter-Integrated Circuit Bus (I2C) protocol, and a Universal Serial Bus (USB) protocol.

18. The tester system of claim 1, wherein said plurality of programmable accelerator circuits include Field Programmable Gate Arrays (FPGAs).

* * * * *